United States Patent
Zhu et al.

(10) Patent No.: US 10,627,942 B2
(45) Date of Patent: Apr. 21, 2020

(54) TOUCH CONTROL STRUCTURE OF AN ACTIVE-MATRIX ORGANIC LIGHT-EMITTING DIODE DISPLAY SCREEN

(71) Applicants: Kunshan New Flat Panel Display Technology Center Co., Ltd., Kushan (CN); KUNSHAN GO-VISIONOX OPTO-ELECTRONICS CO., LTD., Kushan (CN)

(72) Inventors: Shaopeng Zhu, Kushan (CN); Hideo Hirayama, Kushan (CN); Xiuqi Huang, Kushan (CN)

(*) Notice: Subject to any disclaimer, the term of this patent is extended or adjusted under 35 U.S.C. 154(b) by 0 days.

(21) Appl. No.: 16/136,259

(22) Filed: Sep. 20, 2018

(65) Prior Publication Data
US 2019/0018531 A1     Jan. 17, 2019

Related U.S. Application Data

(63) Continuation of application No. 15/102,719, filed as application No. PCT/CN2014/093359 on Dec. 9, 2014, now Pat. No. 10,185,422.

(30) Foreign Application Priority Data

Dec. 9, 2013    (CN) ..................... 2013 2 0801754 U

(51) Int. Cl.
*G06F 3/045* (2006.01)
*G06F 3/041* (2006.01)
(Continued)

(52) U.S. Cl.
CPC ............ *G06F 3/0412* (2013.01); *G06F 3/044* (2013.01); *G06F 3/0416* (2013.01);
(Continued)

(58) Field of Classification Search
CPC ............................... G06F 3/0412; G06F 3/044
See application file for complete search history.

(56) References Cited

U.S. PATENT DOCUMENTS

| | | | |
|---|---|---|---|
| 2008/0278070 | A1 | 11/2008 | Kim |
| 2010/0134426 | A1 | 6/2010 | Lee |

(Continued)

FOREIGN PATENT DOCUMENTS

| | | | |
|---|---|---|---|
| CN | 101894856 A | 11/2010 | |
| CN | 103151467 A | 6/2013 | |

(Continued)

OTHER PUBLICATIONS

Extended European Search Report of EP14870106.3 PCT/CN2014/093359, dated Feb. 8, 2017.
(Continued)

*Primary Examiner* — Nan-Ying Yang
(74) *Attorney, Agent, or Firm* — W&K IP

(57) ABSTRACT

The present invention discloses a touch control structure of an active-matrix organic light-emitting diode display screen, comprising a transmitting structure and a receiving structure that are mutually inductive, the transmitting structure comprises a first encapsulation film, a first patterned electrode and a second encapsulation film; the receiving structure further comprises a flexible polymer foil sheet and a second patterned electrode formed on the flexible polymer foil sheet, the receiving structure and the transmitting structure are assembled by adhering the surface of the flexible polymer foil sheet having the second patterned electrode formed thereon to the second encapsulation film; wherein, the first encapsulation film comprises multiple layers of films including at least one layer of inorganic film, the second encapsulation film comprises multiple layers of films including at least one layer of inorganic film.

9 Claims, 2 Drawing Sheets

(51) Int. Cl.
*G06F 3/044* (2006.01)
*H01L 27/32* (2006.01)
(52) U.S. Cl.
CPC ........ *H01L 27/323* (2013.01); *H01L 27/3244* (2013.01); *G06F 2203/04102* (2013.01); *G06F 2203/04103* (2013.01); *G09G 2300/0426* (2013.01)

(56) References Cited

U.S. PATENT DOCUMENTS

| | | | |
|---|---|---|---|
| 2011/0012845 A1 | 1/2011 | Rothkopf | |
| 2011/0279398 A1* | 11/2011 | Philipp | G06F 3/044 345/174 |
| 2012/0127414 A1* | 5/2012 | Shin | G06F 3/0412 349/139 |
| 2012/0218198 A1* | 8/2012 | Shin | G06F 3/0412 345/173 |
| 2014/0152912 A1* | 6/2014 | Lee | G06F 3/0412 349/12 |
| 2014/0362049 A1 | 12/2014 | Inoue | |
| 2015/0115229 A1* | 4/2015 | Jung | H01L 51/0097 257/40 |

FOREIGN PATENT DOCUMENTS

| | | |
|---|---|---|
| CN | 20368944 A | 7/2014 |
| CN | 203689474 U | 7/2014 |
| JP | 2004-46115 | 2/2004 |
| JP | 2008-216543 A | 9/2008 |
| JP | 2011-23558 A | 2/2011 |
| JP | 2011-27952 A | 2/2011 |
| JP | 2011-100357 A | 5/2011 |
| JP | 2013-218659 A | 10/2013 |
| WO | 2012177312 A1 | 12/2012 |
| WO | 2013125191 A1 | 8/2013 |

OTHER PUBLICATIONS

JP First Office Action of JP2016-537433 dated Feb. 14, 2017.
JP Final Office Action of JP2016-537433 dated Jul. 25, 2017.
First Office Action of Europe Application 14870106.3.

* cited by examiner

TOUCH CONTROL STRUCTURE OF AN ACTIVE-MATRIX ORGANIC LIGHT-EMITTING DIODE DISPLAY SCREEN

This application is a continuation of U.S. utility application Ser. No. 15/102,719, with a filing date Jun. 8, 2016, which is national stage entry (371) of International Patent Application No. PCT/CN2014/093359 with a filing date of Dec. 9, 2014, designating the United States, and further claims priority to Chinese Patent Application No. 201320801754.8 with a filing date of Dec. 9, 2013. The content of the aforementioned applications, including any intervening amendments thereto, are incorporated herein by reference.

TECHNICAL FIELD

The present invention relates to the field of display panels and touch control technology, more specifically, the present invention relates to a touch control structure of an active-matrix organic light-emitting diode (AMOLED) display screen which is a hybrid touch control structure.

BACKGROUND OF THE INVENTION

Touch control has become a necessary configuration of small to medium display panels and has a large market. In order to increase the added value of products and to grasp the touch control technology in their own hands, display panel manufacturers rush to develop embedded touch control technology, mainly including in-cell technology and on-cell technology, wherein the in-cell technology refers to a method in which the touch panel function is embedded within the liquid crystal pixels, and the on-cell technology refers to a method in which the touch panel function is embedded between the color filter substrate and the polarizing plate. As for a flexible active-matrix organic light-emitting diode (AMOLED) display screen, the existence of film encapsulation makes the on-cell technology very hard to be applied, because forming a conventional touch control structure on the film encapsulation requires multiple times of photo-etching which have significant adverse influence on the OLED device beneath the film encapsulation. An OLED device has huge differences from a liquid crystal display device, which makes the in-cell technology very hard to be applied to an OLED device. Therefore, it is needed to provide a touch control means of an active-matrix organic light-emitting diode (AMOLED) display screen that can achieve flexible touch control and minimize its adverse influence on the film encapsulation.

SUMMARY OF THE INVENTION

In order to solve the problem in prior art by minimizing the adverse influence of multiple times of photo-etching on the film encapsulation and reducing the degree of difficulty of the process, the present invention provides a touch control structure of an active-matrix organic light-emitting diode display screen.
The technical solution is as follows:
The present invention provides a touch control structure of an active-matrix organic light-emitting diode display screen which is disposed on a display screen substrate and comprises a transmitting structure and a receiving structure that are mutually inductive, wherein, the transmitting structure comprises a first encapsulation film, a first patterned electrode and a second encapsulation film, the first encapsulation film is formed on an organic light-emitting diode device disposed on the display screen substrate, the first patterned electrode is formed on the first encapsulation film, and the second encapsulation film is formed upon the first patterned electrode; the receiving structure comprises a flexible polymer foil sheet and a second patterned electrode formed on the flexible polymer foil sheet; the receiving structure and the transmitting structure are assembled to form the touch control structure by adhering the surface of the flexible polymer foil sheet having the second patterned electrode formed thereon to the second encapsulation film, wherein the first patterned electrode and the second patterned electrode are disposed across from each other in the assembled touch control structure; wherein, the first encapsulation film comprises multiple layers of films including at least one layer of inorganic film, the second encapsulation film comprises multiple layers of films including at least one layer of inorganic film.

Preferably, the first patterned electrode in the transmitting structure and the second patterned electrode in the receiving structure both have a bar-shaped pattern, and the patterns of the first patterned electrode and the second patterned electrode are formed to be overlapping and complementary patterns.

Further, the bar-shaped pattern of the first patterned electrode and the bar-shaped pattern of the second patterned electrode are arranged orthogonal to each other.

Further preferably, the first encapsulation film also includes one or more layers of organic films.

Preferably, the first patterned electrode and the second patterned electrode both have a thickness of 5 nm-1000 nm.

Preferably, the first encapsulation film and the second encapsulation film both have a thickness of 50 nm-5000 nm.

Preferably, the display screen substrate is a glass substrate or a flexible polymer substrate.

Preferably, the second encapsulation film is composed of alternately formed two pairs of polyacrylate layers and silicon nitride layers, wherein the silicon nitride layer is produced by plasma enhanced chemical vapor deposition and the polyacrylate layer is produced by ink-jet printing followed by ultraviolet curing.

The present invention also provides a preparation method for a touch control structure of an active-matrix organic light-emitting diode display screen, comprising the following steps:
a step of preparing a transmitting structure, comprising: forming a first encapsulation film on an organic light-emitting diode device disposed on a substrate, forming a first patterned electrode on the first encapsulation film, and forming a second encapsulation film upon the first patterned electrode, wherein, the first encapsulation film is formed by multiple layers of films including at least one layer of inorganic film, the second encapsulation film is formed by multiple layers of films including at least one layer of inorganic film;
a step of preparing a receiving structure, comprising: forming a second patterned electrode on a flexible polymer foil sheet; and
a step of assembling the receiving structure and the transmitting structure together to form the touch control structure, comprising: adhering the surface of the flexible polymer foil sheet having the second patterned electrode formed thereon to the second encapsulation film, wherein the first patterned electrode and the second encapsulation film are disposed across from each other in the assembled touch control structure.

Preferably, the second encapsulation film is produced by alternately forming two pairs of polyacrylate layers and silicon nitride layers, wherein the silicon nitride layer is produced by plasma enhanced chemical vapor deposition and the polyacrylate layer is produced by ink-jet printing followed by ultraviolet curing.

The beneficial effects brought about by the technical solution of the present invention are:

(1) In the present invention, the first encapsulation film and the second encapsulation film together constitute an encapsulation layer for the active-matrix organic light-emitting diode display screen, and the first patterned electrode of the touch control structure is embedded within this encapsulation layer. Therefore, not only the organic light-emitting diode device of the display screen can be protected by this encapsulation layer from moisture and oxygen corrosion, but also, with the first patterned electrode of the touch control structure embedded within this encapsulation layer, the overall thickness of the touch control display screen can be significantly reduced.

(2) In the present invention, a first patterned electrode and a second patterned electrode are respectively formed on the first encapsulation film and on the flexible polymer foil, and thus these patterned electrodes can be made from nano silver or grapheme with low cost, which further reduces the cost and at the same time achieves flexible touch control.

(3) In the present invention, the receiving structure is formed on the basis of a flexible polymer foil sheet which is made from materials including but not limited to polyethylene terephthalate, polyethylene terenaphthalate, polyethersulfone, polyimide and parylene, the second patterned electrode of the capacitive touch control sensor is formed on the polymer foil sheet, and the second patterned electrode has the same material, forming method and selection range as those of the first patterned electrode. Because the second patterned electrode is formed directly upon the flexible polymer foil sheet, not upon a device component, the degree of difficulty of the manufacture process is significantly reduced.

BRIEF DESCRIPTION OF THE DRAWINGS

In order to more clearly describe the technical solutions of embodiments of the present invention, hereinafter, the appended drawings required by description of the embodiments will be briefly introduced. Apparently, the appended drawings described below are only directed to some embodiments of the present invention, and for those skilled in the art, without expenditure of creative labor, other drawings can be derived on the basis of these appended drawings.

Figure 1:
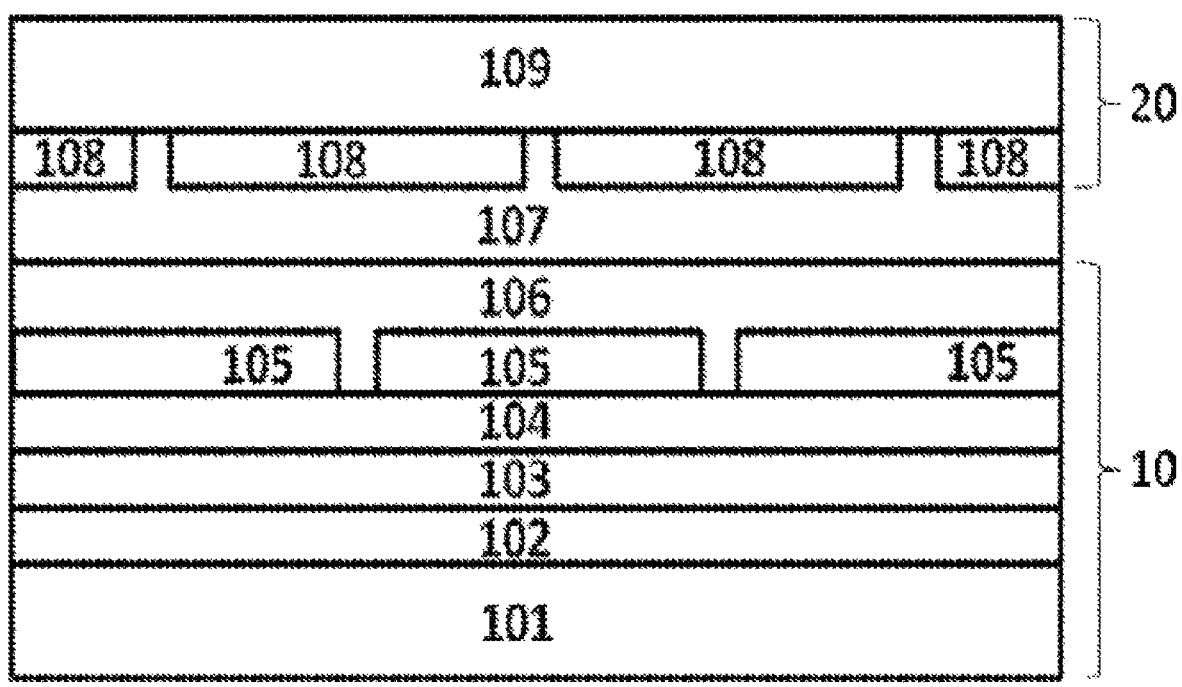
FIG. 1 is a sectional view of the touch control structure of active-matrix organic light-emitting diode display screen provided by the present invention.

In the drawings: 10-transmitting structure, 101-display screen substrate, 102-thin film transistor array, 103-organic light-emitting diode device, 104-first encapsulation film, 105-first patterned electrode, 106-second encapsulation film, 107-glue, 108-second patterned electrode, 109-polymer foil sheet, 20-receiving structure.

DETAILED DESCRIPTION OF EMBODIMENTS

In order to more clearly illustrate the purpose, technical solution and advantages of the present invention, hereinafter, specific embodiments of the present invention will be further described in detail with reference to the appended drawings.

As shown in FIG. 1, the present invention provides a touch control structure of active-matrix organic light-emitting diode display screen which comprises a transmitting structure 10 and a receiving structure 20, wherein, the transmitting structure 10 comprises a first encapsulation film 104, a first patterned electrode 105 and a second encapsulation film 106, the first encapsulation film 104 is formed on an organic light-emitting diode device 103 disposed on the display screen substrate 101, the first patterned electrode 105 is formed on the first encapsulation film 104, and the second encapsulation film 106 is formed upon the first patterned electrode 105; the receiving structure 20 comprises a flexible polymer foil sheet 109 and a second patterned electrode 108 formed on the flexible polymer foil sheet 109, the flexible polymer foil sheet 109 is adhered to the second encapsulation film 106 by glue 107, and the first patterned electrode 105 and the second patterned electrode 108 are oppositely disposed.

Hereinafter, the preparation process of the touch control structure is described in detail:

(I) Preparation of the transmitting structure 10 of the touch control structure A. Selecting a display screen substrate 101 which may be a glass substrate or may be a flexible polymer substrate.

B. Forming a thin film transistor (TFT) array 102 on the display screen substrate 101, which is a technique commonly known to those skilled in the art, and for which low temperature polycrystalline silicon (LTPS), indium gallium zinc oxide (IGZO) and organic thin film transistor (OTFT) can be applied for controlling light emitting of the pixels.

C. Forming an organic light-emitting diode (OLED) device 103 on the thin film transistor (TFT) array 102, wherein, the methods of forming the thin film transistor (TFT) array 102 and the organic light-emitting diode (OLED) device 103 are commonly applied in the art and thus are not restricted herein.

D. Upon the organic light-emitting diode (OLED) device 103, forming a single layer of multiple layers of a first encapsulation film 104 with a function of insulation from water and oxygen, wherein, the first encapsulation film 104 includes at least one layer of inorganic film which is made from materials including but not limited to one or more selected from aluminum oxide, silicon oxide, silicon nitride, titanium dioxide, zirconium oxide, non-crystalline carbon and magnesium oxide by a forming method including but not limited to atom layer deposition, sputtering and chemical vapor deposition; and the first encapsulation film 104 may also include one or more layers of organic films made from materials including but not limited to polyacrylate, polyurea, polyimide and parylene by a forming method including but not limited to organic chemical vapor deposition, ink-jet printing, flash vaporization, organic vapor deposition and spin coating.

E. Forming a first patterned electrode 105 of the capacitive touch control sensor on the first encapsulation film 104, wherein the first patterned electrode 105 is made from materials including but not limited to indium tin oxide, aluminum-doped zinc oxide, fluorine-doped zinc oxide, silver nanowire, carbon nanotube, graphene and conductive polymer by a patterning method including but not limited to photo-etching, ink-jet printing, metal mask and screen printing, and the first patterned electrode 105 has a thickness of 5 nm-1000 nm depending on different materials that are used.

F. Forming a second encapsulation film 106 upon the first patterned electrode 105, wherein, the second encapsulation film 106 has the same material and forming method as that of the first encapsulation film 104, and the first encapsulation film and the second encapsulation film both have a thickness of 50 nm-5000 nm. Thus, the transmitting structure 10 in the touch control structure is produced.

(II) Preparation of the receiving structure 20 of the touch control structure The flexible polymer foil sheet 109 is made of materials including but not limited to polyethylene terephthalate, polyethylene terenaphthalate, polyethersulfone, polyimide and parylene. A second patterned electrode 108 of the capacitive touch control sensor is formed on the flexible polymer foil sheet 109. Preferably, the bar-shaped pattern of the first patterned electrode 108 and the bar-shaped pattern of the second patterned electrode 105 are arranged orthogonal to each other, and the second patterned electrode 108 has the same material, forming method and selection range as those of the first patterned electrode 105. Because the second patterned electrode 108 is formed directly upon the flexible polymer foil sheet 109, not upon a device component, the degree of difficulty of the manufacture process is significantly reduced.

Finally, a surface of the second encapsulation film 106 of the transmitting structure 10 is adhered to a surface of the second patterned electrode 108 of the receiving structure 20 by glue 107, and thereby the second patterned electrode 108 and the first patterned electrode 105 are formed to be overlapping with complementary patterns that are suitable to be used as a capacitive touch control sensor.

Embodiment 1

Figure 2:
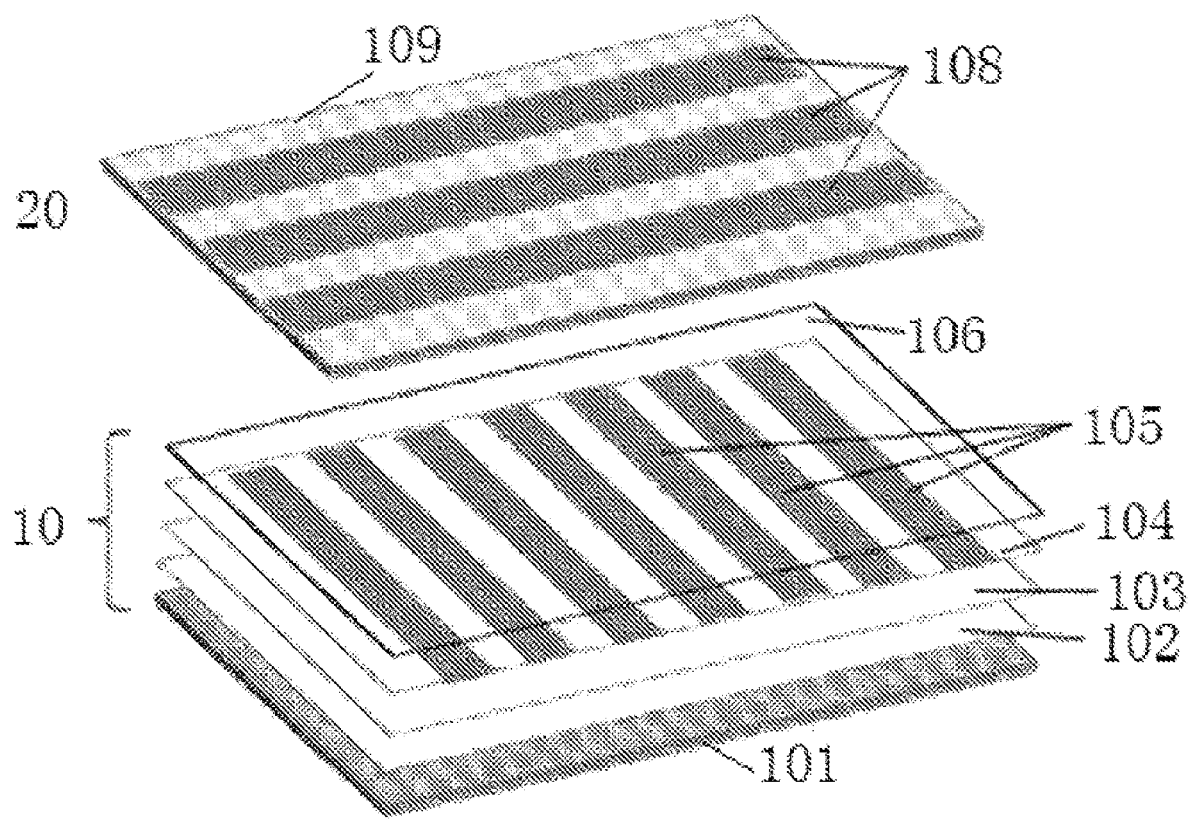
FIG. 2 is a perspective view of the AMOLED touch control structure described by one embodiment of the present invention.

As shown in FIG. 2, the display screen substrate 101 is a flexible polymer substrate made from polyimide. A low temperature polycrystalline silicon thin film transistor array is formed on the display screen substrate, and then an organic light-emitting diode device 103 is formed upon the top electrodes corresponding to this array. The first encapsulation film 104 is composed of alternately formed two pairs of polyacrylate layers and silicon nitride layers, wherein the silicon nitride layer is produced by plasma enhanced chemical vapor deposition and the polyacrylate layer is produced by ink-jet printing followed by ultraviolet curing. The first patterned electrode 105 of the capacitive touch control sensor is formed on the first encapsulation film 104, wherein the first patterned electrode 105 has a bar-shaped pattern and a thickness of 25 nm and is made from indium tin oxide by a preparation method of magnetron sputtering and a patterning method of metal mask. The second encapsulation film 106 is formed upon the first patterned electrode 105 and is composed of alternately formed two pairs of polyacrylate layers and silicon nitride layers, wherein the silicon nitride layer is produced by plasma enhanced chemical vapor deposition and the polyacrylate layer is produced by ink-jet printing followed by ultraviolet curing. The aforementioned processes form a first part of the display screen, i.e. the transmitting structure 10. The second part of the display screen, i.e. the receiving structure 20 comprises a flexible polymer foil sheet 109 and a second patterned electrode 108. Wherein, the flexible polymer foil sheet 109 is made of polyethylene terephthalate, and the second patterned electrode 108 is formed on the flexible polymer foil sheet 109, wherein the second patterned electrode 108 has a thickness of 30 nm and is made from indium tin oxide by a preparation method of magnetron sputtering and a patterning method of photo-etching. Finally, a surface of the second encapsulation film 106 of the transmitting structure 10 is adhered oppositely to a surface of the second patterned electrode 108 of the receiving structure 20 by glue 107, and thereby the transmitting structure 10 is fitted to the receiving structure 20 by glue 107.

The above-mentioned sequence number of embodiment of the present invention is only for description, and does not represent superior or inferior of the embodiment.

The aforementioned contents are only preferable embodiments of the present invention, and should not be interpreted to limit the present invention. Any changes, equivalent substitutes, and modifications made within the inventive concept and principle of the present invention are intended to be embraced within the protection scope of the present invention.

We claim:

1. A touch control structure of an active-matrix organic light-emitting diode display screen, which is disposed on a display screen substrate, characterized in comprising a transmitting structure and a receiving structure that are mutually inductive, wherein, the transmitting structure comprises a first encapsulation film, a first patterned electrode and a second encapsulation film, the first encapsulation film is formed on an organic light-emitting diode device disposed on the display screen substrate, the first patterned electrode is formed on the first encapsulation film, and the second encapsulation film is formed upon the first patterned electrode;

the receiving structure comprises a flexible polymer foil sheet and a second patterned electrode formed on the flexible polymer foil sheet;

the receiving structure and the transmitting structure are assembled to form the touch control structure by adhering the surface of the flexible polymer foil sheet having the second patterned electrode formed thereon to the second encapsulation film, wherein the first patterned electrode and the second patterned electrode are disposed across from each other in the assembled touch control structure;

wherein, the first encapsulation film and the second encapsulation film both comprise at least one layer of inorganic film and at least one layer of organic film, so that the first patterned electrode is embedded within an encapsulation film structure composed of the first encapsulation film and the second encapsulation film the second encapsulation film is composed of alternately formed two pairs of polyacrylate layers and silicon nitride layers, wherein the silicon nitride layer is produced by plasma enhanced chemical vapor deposition and the polyacrylate layer is produced by ink-jet printing followed by ultraviolet curing.

2. The touch control structure of an active-matrix organic light-emitting diode display screen in accordance with claim 1, characterized in that, the first patterned electrode in the transmitting structure and the second patterned electrode in the receiving structure both have a bar-shaped pattern, and the patterns of the first patterned electrode and the second patterned electrode are formed to be overlapping and complementary patterns.

3. The touch control structure of an active-matrix organic light-emitting diode display screen in accordance with claim 2, characterized in that, the bar-shaped pattern of the first patterned electrode and the bar-shaped pattern of the second patterned electrode are arranged orthogonal to each other.

4. The touch control structure of an active-matrix organic light-emitting diode display screen in accordance with claim 1, characterized in that, the first patterned electrode and the second patterned electrode both have a thickness of 5 nm-1000 nm.

5. The touch control structure of an active-matrix organic light-emitting diode display screen in accordance with claim 4, characterized in that, the first encapsulation film and the second encapsulation film both have a thickness of 50 nm-5000 nm.

6. The touch control structure of an active-matrix organic light-emitting diode display screen in accordance with claim 1, characterized in that, the display screen substrate is a glass substrate or a flexible polymer substrate.

7. The touch control structure of an active-matrix organic light-emitting diode display screen in accordance with claim 1, characterized in that, the first encapsulation film has the same material and forming method as that of the second encapsulation film.

8. A preparation method for a touch control structure of an active-matrix organic light-emitting diode display screen, characterized in comprising the following steps:
   a step of preparing a transmitting structure, comprising: forming a first encapsulation film on an organic light-emitting diode device disposed on a substrate, forming a first patterned electrode on the first encapsulation film, and forming a second encapsulation film upon the first patterned electrode, wherein, the first encapsulation film and the second encapsulation film are both formed by at least one layer of inorganic film and at least one layer of organic film, so that the first patterned electrode is embedded within an encapsulation film structure composed of the first encapsulation film and the second encapsulation film, the second encapsulation film is produced by alternately forming two pairs of polyacrylate layers and silicon nitride layers, wherein the silicon nitride layer is produced by plasma enhanced chemical vapor deposition and the polyacrylate layer is produced by ink-jet printing followed by ultraviolet curing;
   a step of preparing a receiving structure, comprising: forming a second patterned electrode on a flexible polymer foil sheet; and
   a step of assembling the receiving structure and the transmitting structure together to form the touch control structure, comprising: adhering the surface of the flexible polymer foil sheet having the second patterned electrode formed thereon to the second encapsulation film, wherein the first patterned electrode and the second encapsulation film are disposed across from each other in the assembled touch control structure.

9. The preparation method in accordance with claim 8, characterized in that, first encapsulation film is formed by the same material and method as the second encapsulation film.

\* \* \* \* \*